(12) United States Patent
Hopkins

(10) Patent No.: US 10,121,670 B2
(45) Date of Patent: Nov. 6, 2018

(54) METHODS OF FABRICATING SEMICONDUCTOR STRUCTURES

(71) Applicant: Micron Technology, Inc., Boise, ID (US)

(72) Inventor: John D. Hopkins, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/678,747

(22) Filed: Aug. 16, 2017

(65) Prior Publication Data
US 2017/0365481 A1    Dec. 21, 2017

Related U.S. Application Data

(62) Division of application No. 14/508,237, filed on Oct. 7, 2014, now Pat. No. 9,793,124.

(51) Int. Cl.
*H01L 29/423*    (2006.01)
*H01L 29/792*    (2006.01)
*H01L 21/28*    (2006.01)
*H01L 29/66*    (2006.01)
*H01L 29/788*    (2006.01)
*H01L 27/11556*    (2017.01)
*H01L 27/11582*    (2017.01)

(52) U.S. Cl.
CPC .. *H01L 21/28273* (2013.01); *H01L 21/28282* (2013.01); *H01L 27/11556* (2013.01); *H01L 27/11582* (2013.01); *H01L 29/66825* (2013.01); *H01L 29/66833* (2013.01); *H01L 29/7889* (2013.01); *H01L 29/7926* (2013.01)

(58) Field of Classification Search
CPC ......... H01L 27/11582; H01L 27/11556; H01L 2924/0002; H01L 29/66825; H01L 27/11517; H01L 29/42324; H01L 29/788; H01L 29/42328; H01L 29/4234; H01L 29/42364; H01L 29/42336
See application file for complete search history.

(56) References Cited

U.S. PATENT DOCUMENTS 5,566,778 A    10/1996   Valier et al.
2010/0240205 A1    9/2010   Son et al.
(Continued)

*Primary Examiner* — Marc Armand
*Assistant Examiner* — Quinton Brasfield
(74) *Attorney, Agent, or Firm* — TraskBritt

(57) ABSTRACT

Methods of fabricating a semiconductor structure comprise forming an opening through a stack of alternating tier dielectric materials and tier control gate materials, and laterally removing a portion of each of the tier control gate materials to form control gate recesses. A charge blocking material comprising a charge trapping portion is formed on exposed surfaces of the tier dielectric materials and tier control gate materials in the opening. The control gate recesses are filled with a charge storage material. The method further comprises removing the charge trapping portion of the charge blocking material disposed horizontally between the charge storage material and an adjacent tier dielectric material to produce air gaps between the charge storage material and the adjacent tier dielectric material. The air gaps may be substantially filled with dielectric material or conductive material. Also disclosed are semiconductor structures obtained from such methods.

13 Claims, 12 Drawing Sheets

(56) References Cited

U.S. PATENT DOCUMENTS

| | | | |
|---|---|---|---|
| 2010/0247805 A1* | 9/2010 | Kabe | H01L 21/02238 427/575 |
| 2011/0147823 A1 | 6/2011 | Kuk et al. | |
| 2013/0049093 A1* | 2/2013 | Lee | H01L 21/28273 257/316 |
| 2013/0049095 A1 | 2/2013 | Whang et al. | |
| 2013/0292757 A1 | 11/2013 | Aritome et al. | |
| 2013/0334589 A1* | 12/2013 | Ahn | H01L 29/7926 257/324 |
| 2014/0160841 A1* | 6/2014 | Koval | H01L 29/7883 257/316 |
| 2014/0203344 A1 | 7/2014 | Hopkins et al. | |
| 2014/0264532 A1 | 9/2014 | Dennison et al. | |
| 2015/0200199 A1 | 7/2015 | Sakamoto et al. | |
| 2016/0099323 A1 | 4/2016 | Hopkins | |

* cited by examiner

METHODS OF FABRICATING SEMICONDUCTOR STRUCTURES

CROSS-REFERENCE TO RELATED APPLICATION

This application is a divisional of U.S. patent application Ser. No. 14/508,237, filed Oct. 7, 2014, now U.S. Pat. No. 9,793,124, issued Oct. 17, 2017, the disclosure of which is hereby incorporated herein in its entirety by this reference.

FIELD

The present disclosure, in various embodiments, relates generally to semiconductor device design and fabrication. More particularly, the present disclosure relates to design and fabrication of memory devices having three-dimensionally arranged memory cells.

BACKGROUND

Semiconductor memory devices may be classified into volatile memory devices and nonvolatile memory devices. In contrast to volatile memory devices, nonvolatile memory devices, such as Flash memory devices, retain stored data even when power is removed. Therefore, nonvolatile memory devices, such as Flash memory devices, are widely used in memory cards and in electronic devices. Due to rapidly growing digital information technology, there are demands to continuingly increase the memory density of the Flash memory devices while maintaining, if not reducing, the size of the devices.

Three-dimensional (3D)-NAND Flash memory devices have been investigated for increasing the memory density. The 3D-NAND architecture includes a stack of memory cells having charge storage structures (e.g., floating gates, charge traps or the like), a stack of alternating control gates and dielectric materials, and charge blocking materials disposed between the charge storage structures and the adjacent control gates. An oxide material, such as silicon oxide, is conventionally used as the dielectric material. The charge blocking material may be an inter-poly dielectric (IPD) material, such as oxide-nitride-oxide (ONO) material.

FIG. 1 shows a semiconductor structure 100 that may be further processed to form a 3D-NAND Flash memory device. The semiconductor structure 100 includes a stack 110 of alternating tier control gates 108 and tier dielectric materials 105 over a material 103 to be used as a control gate of a select device, such as a select gate source (SGS) or a select gate drain (SGD), floating gates 400, charge blocking material (411, 412, 413) positioned between the floating gates 400 and adjacent tier control gates 108, and a channel material 600 extending through the stack 110, the select gate material 103, a source dielectric material 102, and a portion of a source 101. The semiconductor structure 100 may further include a tunnel oxide material 580 between the floating gates 400 and the channel material 600. The source 101 could be formed in and/or on a substrate, such as a semiconductor substrate comprising monocrystalline silicon. Optionally, the semiconductor structure 100 may include an etch stop material 104 (as shown in FIG. 1). The control gates 108 each has a height of $H_1$. The floating gates 400 each has a height of $H_2$. Due to the presence of the charge blocking material (411, 412, 413) around the discrete floating gate 400, the height $H_2$ of each discrete floating gate 400 is less than the height $H_1$ of an adjacent tier control gate 108. In addition, the floating gate 400 is not aligned with the adjacent tier control gate 108.

During use and operation, charge may get trapped on a charge trapping portion of the charge blocking material (e.g., nitride portions 412 of the charge blocking material (412, 413)) that are horizontally disposed between a floating gate (400) and adjacent tier dielectric material (105), but not vertically disposed between the floating gates (400) and adjacent tier control gates (108). Trapped charge can migrate along the charge blocking material (412, 413), such as through program, erase or temperature cycling. The presence of the charge blocking material (412, 413) creates a direct path for programming/erasing into the charge trapping portion of the charge blocking material (e.g., the nitride portions 412 of the charge blocking material (412, 413)) and degrades cell program-erase cycling. Such charge trapping or movement can alter the threshold voltage ($V_t$) of the memory cells or degrade incremental step pulse programming (ISPP) relative to memory cells that do not have such charge trapping in the nitride. Charge trap jeopardizes the controllability of the channel characteristics and the reliability of the 3D-NAND Flash memory device. Therefore, it would be beneficial to minimize charge trap in the horizontal ONO charge blocking material portions.

DETAILED DESCRIPTION

Figure 1:
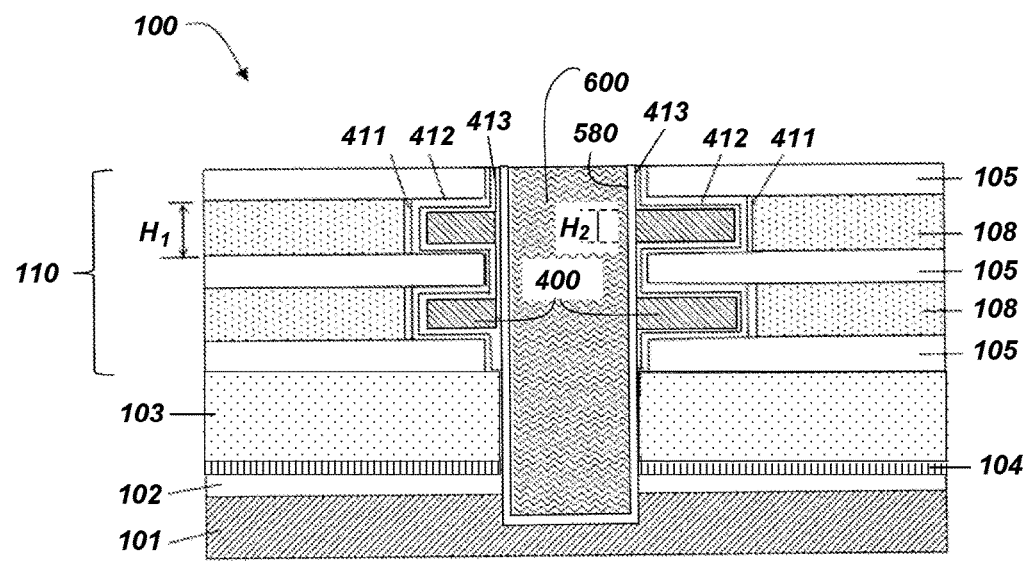
FIG. 1 shows a semiconductor structure suitable for processing of a 3D-NAND Flash memory device.

The following description provides specific details, such as material types, material thicknesses, and processing conditions in order to provide a thorough description of embodiments of the disclosure. However, a person of ordinary skill in the art will understand that embodiments of the present disclosure may be practiced without employing these specific details. Indeed, the embodiments of the present disclosure may be practiced in conjunction with conventional fabrication techniques employed in the industry.

In addition, the description provided herein does not form a complete process flow for forming a semiconductor device structure, and the semiconductor device structures described below do not form a complete semiconductor device. Only those process acts and structures necessary to understand the embodiments of the present disclosure are described in detail below. Additional acts to form the complete semiconductor device may be performed by conventional fabrication techniques. Also, the drawings accompanying the application are for illustrative purposes only, and are thus not necessarily drawn to scale. Elements common between figures may retain the same numerical designation. Furthermore, while the materials described and illustrated herein may be formed as layers, the materials are not limited thereto and may be formed in other three-dimensional configurations.

As used herein, any relational terms, such as "first," "second," and "third," are used for clarity and convenience in understanding the present disclosure and accompanying drawings and does not connote or depend on any specific preference, orientation or order. It is understood that, although the terms "first," "second," and "third" are used herein to describe various elements, these elements should not be limited by these terms. These terms are only used to distinguish one element from another.

As used herein, the terms "horizontal" and "lateral" are defined as a plane parallel to the plane or surface of a wafer or substrate, regardless of the actual orientation of the wafer or substrate. The term "vertical" refers to a direction perpendicular to the horizontal plane as defined above. The term "height" is defined as a dimension of the structure in a direction perpendicular to the horizontal plane as defined above.

As used herein, the term "substantially," in reference to a given parameter, property or condition, means to a degree that one of ordinary skill in the art would understand that the given parameter, property, or condition is met with a small degree of variance, such as within acceptable manufacturing tolerances.

As used herein, the term "critical dimension" means and includes a dimension of a feature within design tolerances in order to achieve the desired performance of the device and to maintain the performance consistency of the device. This dimension may be obtained on a device structure as a result of different combinations of fabrication processes, which may include, but are not limited to, photolithography, etch (dry/wet), diffusion, or deposition acts.

FIGS. 2-13 are cross-sectional views of various stages of forming floating gates for a 3D-NAND Flash memory device according to an embodiment of the present disclosure.

Figure 2:
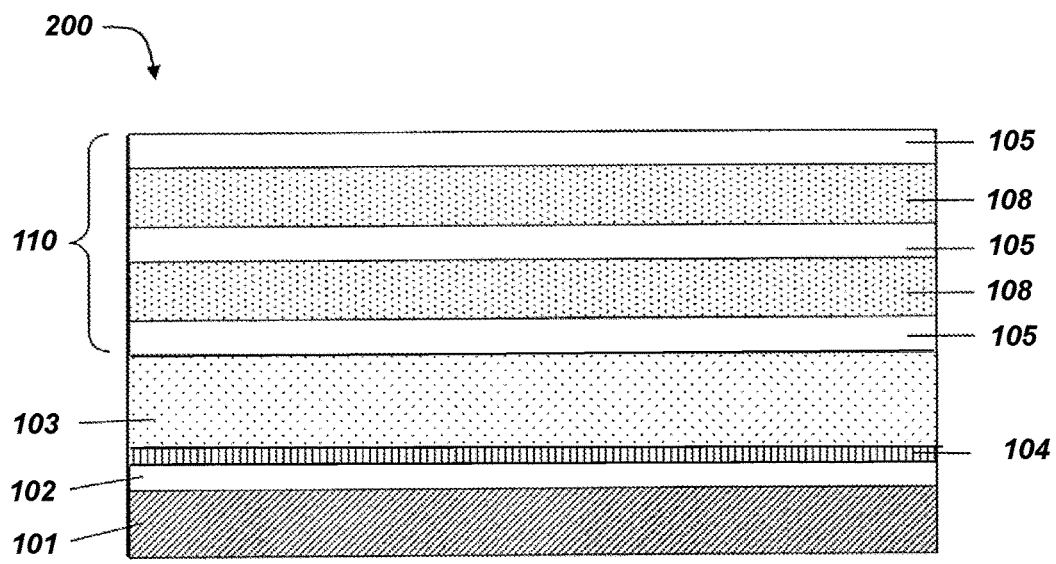
FIGS. 2-13 are cross-sectional views of various stages in the formation of a semiconductor structure according to an embodiment of the present disclosure.

FIG. 2 shows a semiconductor structure 200 including a source 101, a source oxide material 102, optionally an etch stop material 104, a material 103 to be used as a control gate of a select device (e.g., SGS), and a stack 110 of alternating tier dielectric materials 105 and tier control gate materials 108 (of memory cells). The source 101 may be formed on a substrate (not shown) from doped polysilicon, tungsten silicide (WSi$_x$), or other conventional materials for sources. The etch stop material 104 may be aluminum oxide or other conventional etch stop material selected so that the materials of the stack 110 may be selectively removed without removing other materials of the semiconductor structure 200. Any known dielectric materials may be used for the alternating tier dielectric materials 105 in the stack 110. By way of non-limiting example, the alternating tier dielectric materials 105 may include, but are not limited to, silicon oxide, silicon nitride, silicon oxynitride, or another high-k insulating material. In one embodiment, the tier dielectric material 105 is silicon oxide. The tier control gate material 108 may be formed from any known conductive material. Non-limiting examples of such tier conductive materials may include n-doped polysilicon, p-doped polysilicon, or undoped polysilicon. In one embodiment, the tier control gate material 108 may be n-doped polysilicon. The formation of the alternating tier dielectric materials 105 and tier control gate materials 108 may be repeated to create the stack 110 of alternating tier dielectric materials 105 and tier control gates 108.

As used herein, the term "substrate" means and includes a base material or construction upon which additional materials are formed. The substrate may be, for example, a semiconductor substrate, a base semiconductor material on a supporting structure, a metal electrode or a semiconductor substrate having one or more materials, structures or regions formed thereon. The substrate may be a conventional silicon substrate, or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, or other semiconductor or optoelectronic materials, such as silicon-germanium (Si$_{1-x}$Ge$_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process acts may have been conducted to form materials, regions, or junctions in the base semiconductor structure or foundation. In one embodiment, the substrate is a silicon-containing material, such as a silicon substrate. The substrate may be doped or undoped. In one embodiment, the substrate may be p-doped polysilicon.

The semiconductor structure 200 may include films of the respective materials. The source 101, source oxide material 102, etch stop material 104, a select gate material 103, and stack 110 of alternating tier dielectric materials 105 and tier control gates 108 may be formed by conventional techniques, which are not described in detail herein.

Figure 3:
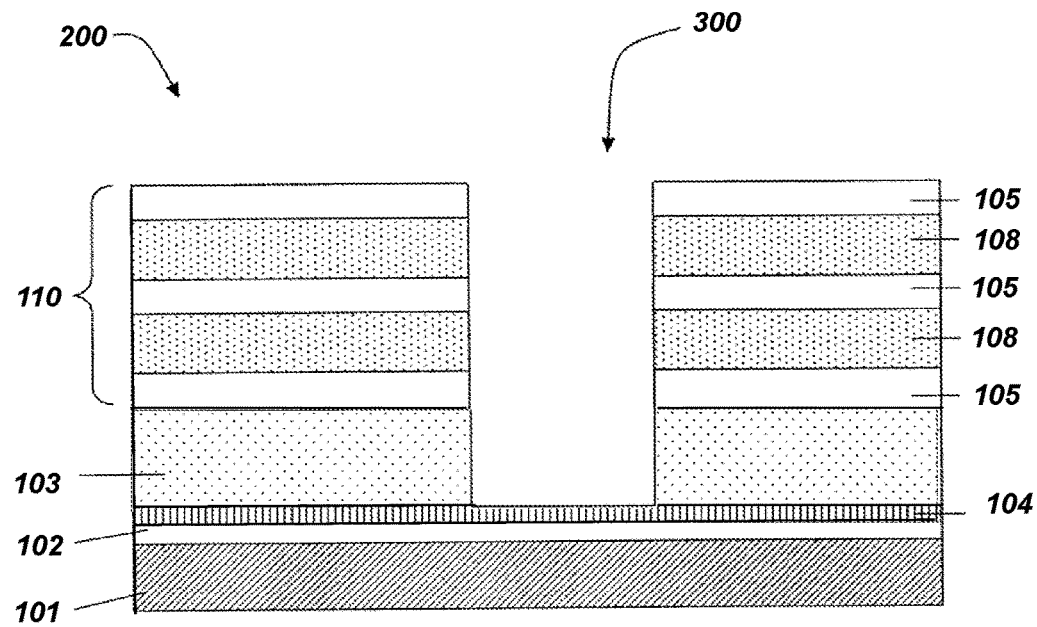

Referring to FIG. 3, the semiconductor structure 200 of FIG. 2 is subjected to a removal process (e.g., an etch process) to create an opening 300 through the select gate material 103 and the stack 110 of alternating tier dielectric materials 105 and tier control gates 108. By way of non-limiting example, portions of the select gate material 103 and the stack 110 may be removed using an anisotropic dry etch process. The opening 300 may be formed using any conventional dry etch chemistry (i.e., a reactive ion etch). In one embodiment, the opening 300 has an aspect ratio of at least 20:1. The semiconductor structure 200 may include one opening 300 or more than one openings. Although the structure 200 of FIG. 3 shows only one opening 300, it is understood that the semiconductor structure 200 may include more than one opening.

Figure 4:
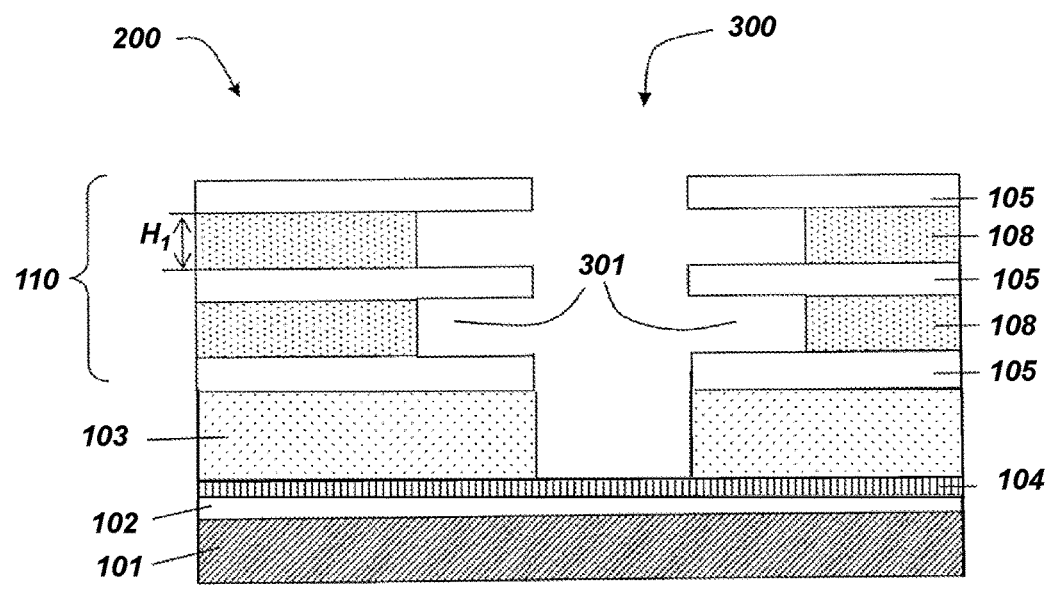

In FIG. 4, a portion of each of the tier control gates material 108 in the stack 110 may be selectively removed relative to adjacent tier dielectric materials 105 to create first recesses 301 having a height of H$_1$. The first recesses 301 may be formed by laterally removing the portions of the tier control gates material 108. Following the removal, the adjacent tier dielectric materials 105 may extend laterally beyond the remaining adjacent tier control gate materials 108, defining upper and lower boundaries of the first recesses 301. In some embodiments, the selective removal of the tier control gates material 108 may be achieved by wet etching the semiconductor structure 200 using a solution of tetramethylammonium hydroxide (TMAH).

Figure 5:
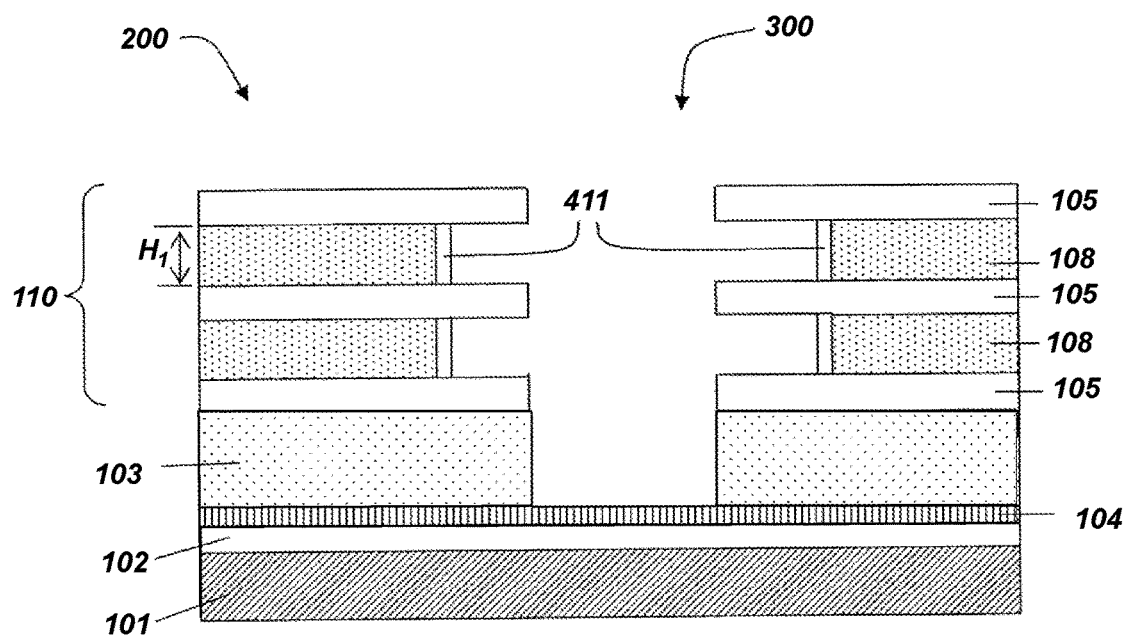

Referring to FIG. 5, a first dielectric material 411, such as an oxide material, may be selectively formed over sidewalls of the tier control gate 108 in the first recesses 301. By way of non-limiting example, the first dielectric material 411 may include silicon oxide, silicon nitride, silicon oxynitride, or other high-k insulating material. In some embodiments, the first dielectric material 411 may be silicon oxide. Any conventional method for forming the dielectric material 411 may be used. By way of non-limiting example, the first dielectric material 411 may be formed by chemical vapor deposition (CVD), atomic layer deposition (ALD), physical vapor deposition (PVD), or combinations thereof. To selectively form the first dielectric material 411, the first dielectric material 411 may be grown on the tier control gate material 108. Thus, sidewalls of the adjacent tier dielectric materials 105 of the stack 110 and the etch stop material 104 may remain substantially free of the first dielectric material 411. In one embodiment, the first dielectric material 411 may be grown on an exposed surface of tier control gate material 108 through an in-situ steam generation (ISSG) process, physical vapor deposition (PVD), furnace growth (diffusion), or combinations thereof.

Figure 6:
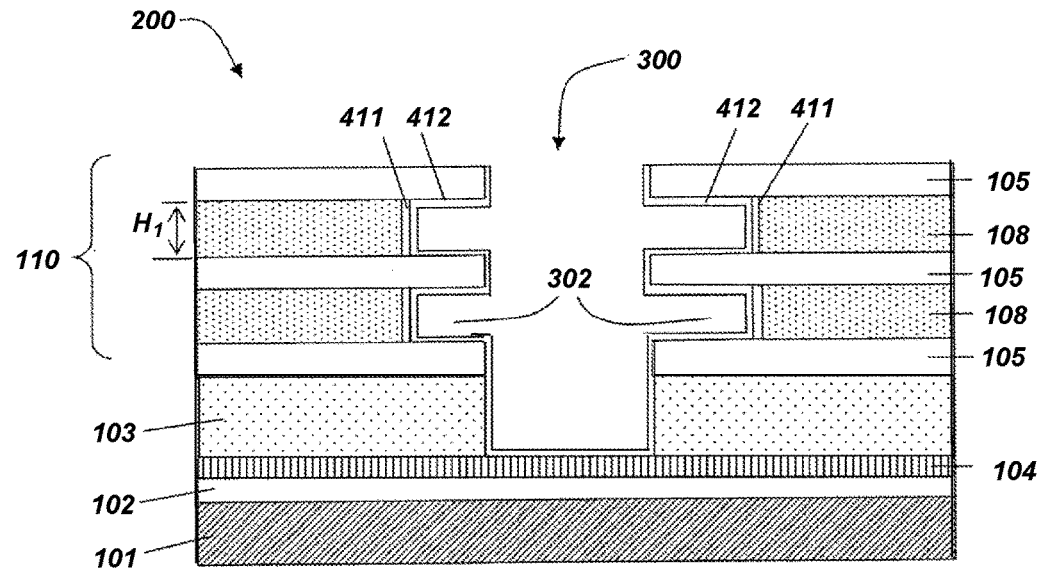

In FIG. 6, a second dielectric material 412 is substantially conformally formed on exposed surfaces of the adjacent tier dielectric materials 105, the first dielectric materials 411 in the second recesses 302, the select gate material 103, and the etch stop material 104. In some embodiments, the second dielectric material 412 comprises a nitride material, such as silicon nitride. Any conventional method for forming the second dielectric material may be used.

Figure 7:
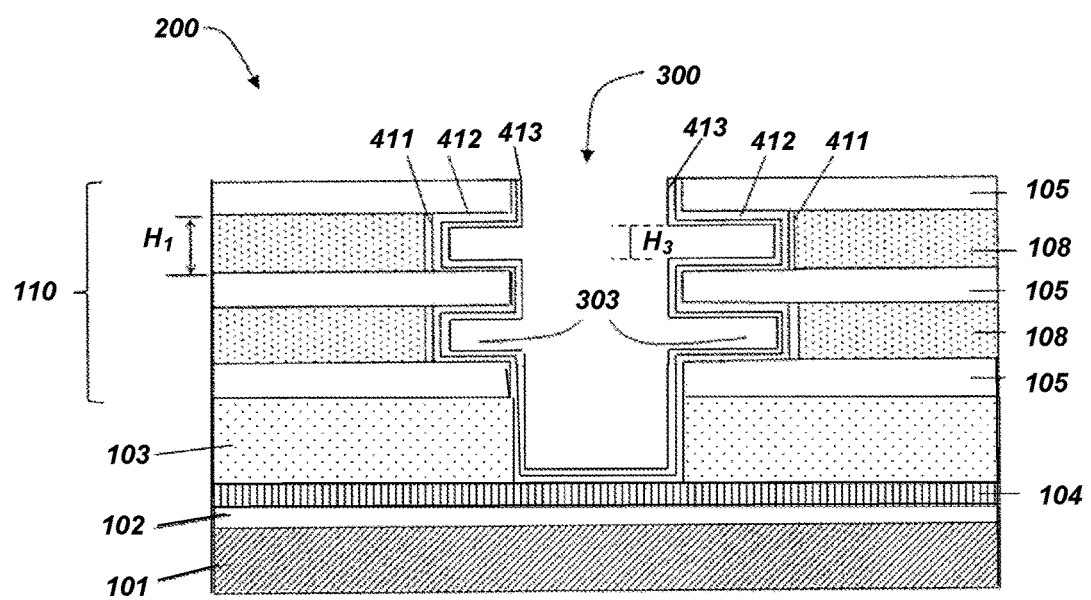
Figure 8:
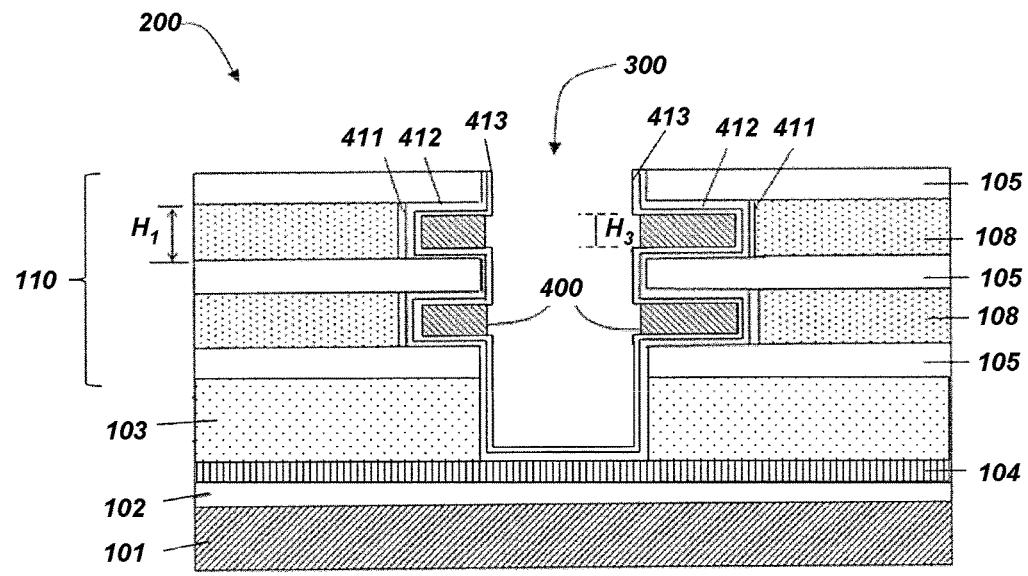

A third dielectric material 413 may be substantially conformally formed over the second dielectric material 412, providing the semiconductor structure 200 of FIG. 7 having the third recesses 303. As shown in FIG. 7, due to the presence of the charge blocking material (411, 412, 413) in the third recesses 303, the height $H_3$ of each of the third recesses 303 is less than the height $H_1$ of adjacent tier control gate 108. Any conventional method for forming the third dielectric material 413 may be used, such as chemical vapor deposition (CVD), atomic layer deposition (ALD), physical vapor deposition (PVD), or combinations thereof. The third dielectric material 413 may include silicon oxide, silicon nitride, silicon oxynitride, or another high-k insulating material. In some embodiments, the third dielectric material 413 is silicon oxide. The first and third dielectric materials 411, 413, respectively, may be independently selected so that the same or different materials are used. Depending on the materials selected, the semiconductor structure 200 may include an oxide-nitride-oxide (ONO) structure material of the first dielectric oxide material 411—the second dielectric nitride material 412—the third dielectric oxide material 413. In some embodiments, the thickness of the ONO structure may be about 150 Å.

The material of the floating gate 400 may be formed in the third recesses 303 adjacent to the third dielectric material 413 to substantially fill the remaining volume of the third recesses 303. After substantially filling the third recesses 303, excess material of the floating gate 400 may be removed to provide the semiconductor structure 200 of FIG. 8. The floating gate material 400 may be separated from the adjacent tier control gate material 108 by the charge blocking material (411, 412, 413). Due to the presence of the charge blocking material (411, 412, 413) around the discrete floating gate 400, the height $H_3$ of each discrete floating gate 400 is less than the height $H_1$ of adjacent tier control gate 108.

Thus, the semiconductor structure 200 includes floating gates 400 that are discrete and isolated from one another and from the adjacent tier control gates 108 by the charge blocking material (411, 412, 413). By way of non-limiting example, the floating gate material 400 may include silicon, germanium, or silicon germanium. In one embodiment, the floating gate material 400 is polysilicon, such as n-doped polysilicon, p-doped polysilicon, or undoped polysilicon. The tier control gate material 108 and the floating gate material 400 may be independently selected so that the same or different materials are used. In one embodiment, the tier control gate material 108 and the floating gate material 400 are polysilicon. Any conventional method for forming the floating gate material 400 may be used.

Non-limiting examples of techniques for removing the excess floating gate material 400 may include, but are not limited to, vapor ammonia, a mixture of ammonium fluoride and nitric acid ($NH_4F/HNO_3$), an ozone or hydrofluoric acid (HF) mix or cycle, a mixture of hydrofluoric acid and nitric acid ($HF/HNO_3$), or a tetramethyl ammonium hydroxide (TMAH) process. The process used to remove any excess floating gate material 400 may depend on the doping of the floating gate material 400. For example, if the floating gate material 400 is an n-doped polysilicon, a TMAH solution may be used to remove the excess floating gate material 400.

Figure 9:
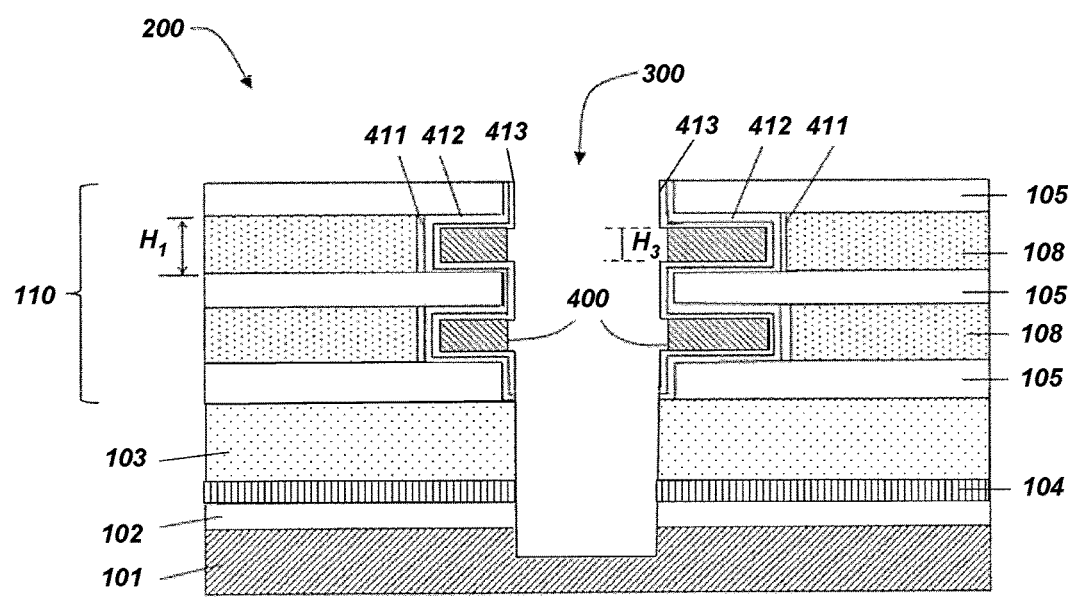

In FIG. 9, the depth of the opening 300 may be increased such that the opening 300 extends through the etch stop material 104, the source oxide material 102, and at least a portion of the source 101 to allow electrical contact to the source 101. Any conventional method for removing the select gate material 103, the source oxide material 102 and at least a portion of the source 101 may be used.

Figure 10:
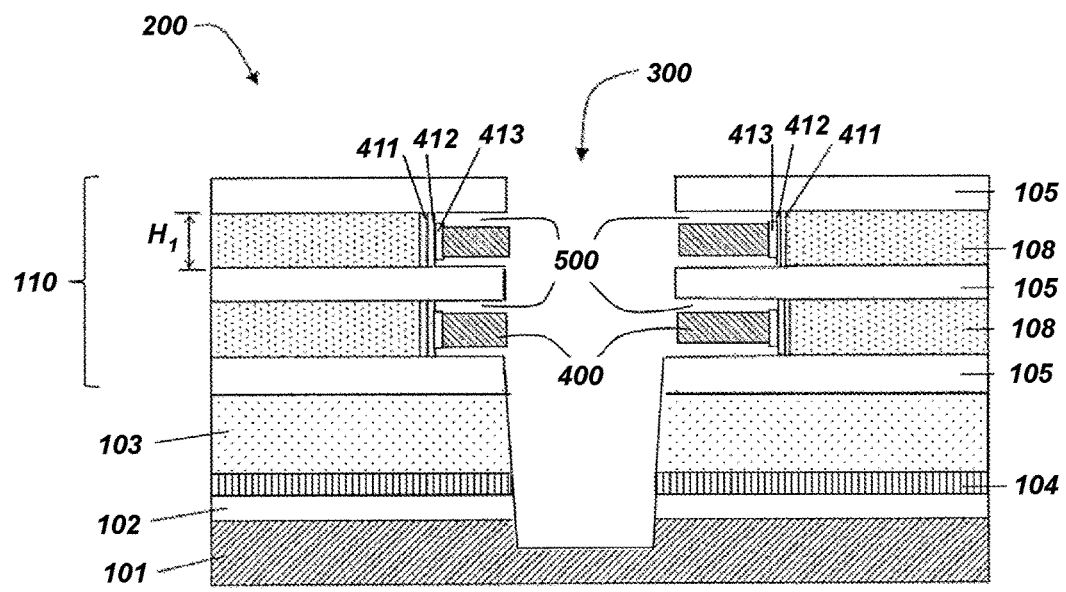

Referring to FIG. 10, portions of the second and third dielectric materials 412, 413 may be selectively removed from the vertical surfaces of adjacent tier dielectric materials 105 and from the horizontal surfaces of adjacent tier dielectric materials 105 without substantial removal of the first dielectric material 411, the second dielectric material 412, and the third dielectric material 413 that are positioned vertically between the floating gate 400 and adjacent tier control gate 108.

The selected portions of the third dielectric material 413, such as the oxide of ONO material, may be removed by wet etching with a hydrogen fluoride (HF) solution or a buffered oxide etch (BOE) solution. Thereafter, the selected portions of the second dielectric material 412, such as the nitride of ONO material, may be removed without substantially removing the first dielectric material 411 to provide the structure 200 of FIG. 10. Such portions of the second dielectric material 412 may be selectively removed by wet etching with a hot phosphoric acid solution or a dilute hydrofluoride solution (e.g., HF:water of 1:2000). As shown in FIG. 10, the semiconductor structure 200 includes air gaps 500 positioned horizontally between the floating gates 400 and adjacent tier dielectric materials 105.

As discussed previously, during use and operation of a conventional semiconductor structure 100 as shown in FIG. 1, charge may get trapped in the charge trapping portions of the charge blocking material, such as the nitride portions 412 of the ONO charge blocking material (411, 412, 413), that are horizontally disposed between the floating gates 400 and adjacent tier dielectric materials 105. These undesirable trapped charges in the horizontal charge trapping portions of the charge blocking material may jeopardize the controllability of the channel characteristics and the reliability of the 3D-NAND Flash memory device.

However, in the semiconductor structure 200 of FIG. 10, the horizontal charge trapping portions of the charge blocking material (e.g., nitride portions 412 of the ONO charge blocking material (411, 412, 413)) are not present. Therefore, during use and operation of the disclosed semiconductor structure 200, the undesirable charge trap may be reduced or eliminated.

Figure 11:
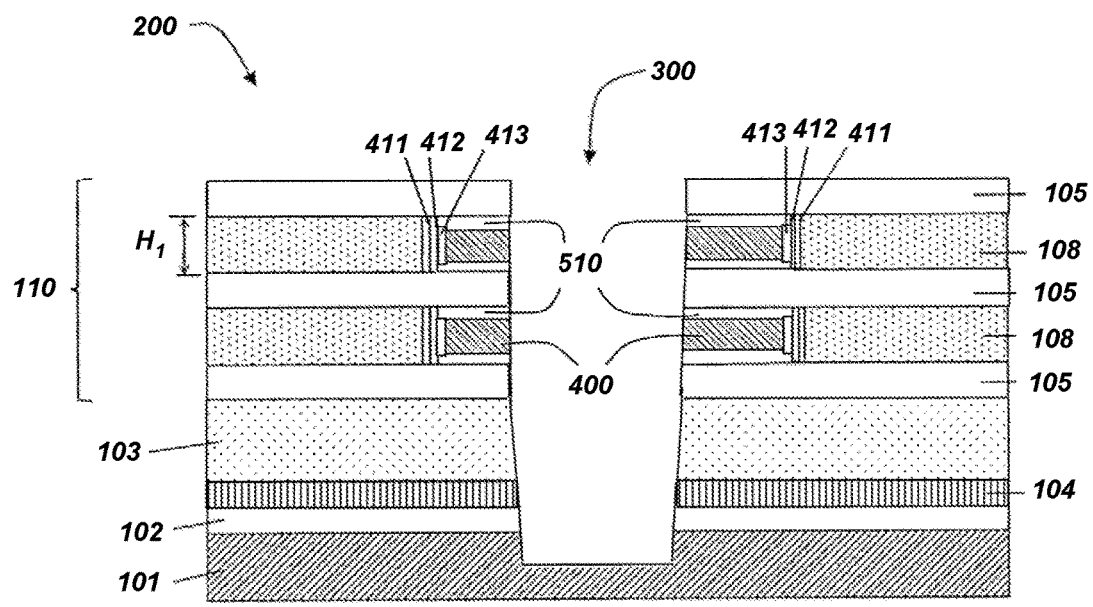

Referring to FIG. 11, the air gaps 500 may be substantially filled with a dielectric material 510. The dielectric material 510 may be formed in the air gaps 500 by conventional techniques, which are not described in detail herein. Any excess dielectric material 510 may be removed by a wet etching process using a hydrogen fluoride (HF) solution or a buffered oxide etch (BOE) solution. It is understood that the dielectric material 510 may not completely fill the air gaps 500. Therefore, air voids may be present in the dielectric material 510. In some embodiments, the dielectric material 510 comprises silicon oxide. In some embodiments, the dielectric material 510 comprises a high-k dielectric oxide material. Non-limiting examples for the suitable high-k dielectric oxide materials may include, but are not limited to, hafnium oxide, zirconium oxide, tantalum oxide, and combinations thereof.

In one embodiment, the dielectric material 510 is silicon oxide. The silicon oxide 510 may be formed in the air gaps 500 by in situ steam generation (ISSG) process, atomic layer deposition (ALD) process, furnace growth (diffusion) process, or combinations thereof. In one embodiment, the air gaps 500 are substantially filled with a low quality silicon oxide material 510 that may thereafter be converted to a higher quality silicon oxide material by a rapid thermal oxidation (RTO) process or an ISSG oxidation process. In one embodiment, a higher quality silicon oxide material 510 is grown by an in situ steam generation (ISSG) process to substantially fill the air gaps 500. In one embodiment, the silicon oxide material 510 may be substantially conformally formed in the air gaps 500 by atomic layer deposition (ALD) process or furnace growth (diffusion) process to provide the silicon oxide material 510 with uniform thickness.

Although FIG. 11 shows that the air gaps 500 are substantially filled with the dielectric material 510, it is understood that when appropriate the air gaps 500 may be left unfilled.

Figure 12:
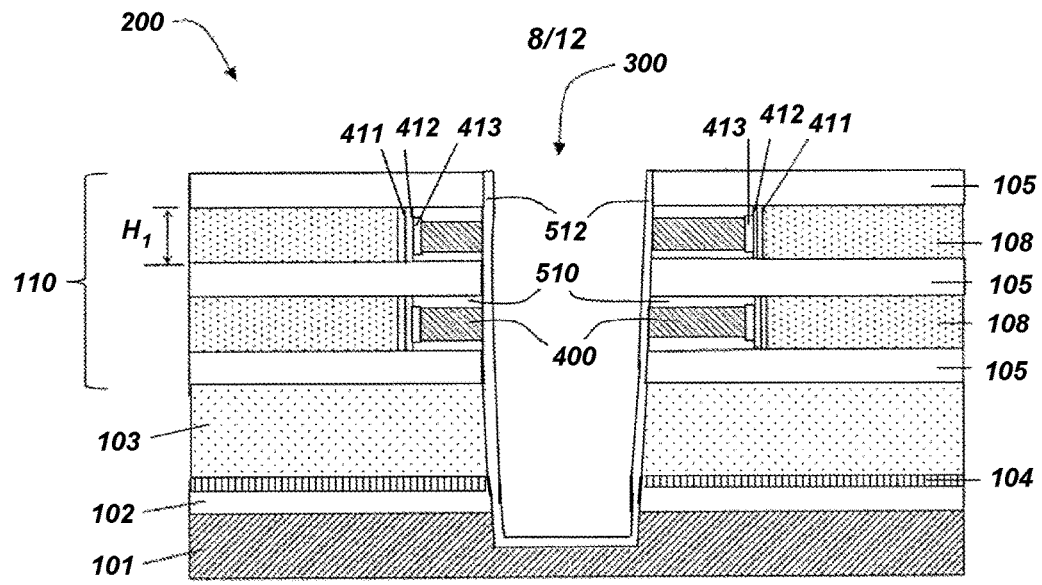

Referring to FIG. 12, a tunnel dielectric material 512 (e.g., tunnel oxide material) may be formed substantially conformally on sidewalls of the opening 300. Any conventional method for forming a tunnel dielectric material may be used. The tunnel dielectric material 512 and the dielectric material 510 may be independently selected so that the same or different materials are used. In one embodiment, the tunnel dielectric material 512 and the dielectric material 510 are silicon oxide.

Figure 13:
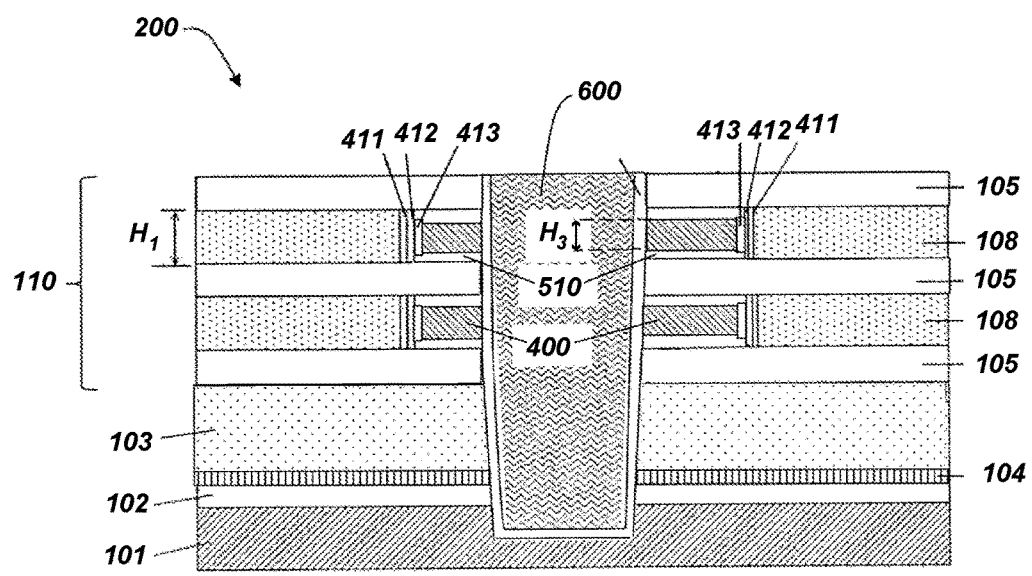

In FIG. 13, a channel material 600 may be formed to substantially fill the opening 300 of the semiconductor structure 200. By way of non-limiting example, the channel material 600 may be conductively doped polysilicon. Any conventional method for forming the channel material 600 may be used. Due to the presence of the dielectric material 510 around the discrete floating gate 400, the height $H_3$ of each discrete floating gate 400 is less than the height $H_1$ of adjacent tier control gate 108. In some embodiments, the semiconductor structure 200 of FIG. 13 may be subjected to a cleaning process prior to substantially filling the opening 300 with the channel material 600. Any conventional cleaning processes may be used.

As shown in FIG. 13, the semiconductor structure 200 does not include any charge trapping portion (e.g., nitride portion 412) disposed horizontally between the floating gates 400 and adjacent tier dielectric materials 105. Therefore, no charge trapping may occur. Furthermore, the dielectric material 510 around the discrete floating gates 400 may help shield the undesirable fringe field from the adjacent floating gates 400, and reduce interference from the adjacent tier control gate 108.

Accordingly, in one embodiment of present disclosure, a semiconductor structure comprises a stack of alternating tier dielectric materials and tier control gates, and a charge storage structure laterally adjacent to each of the tier control gates. The semiconductor structure further comprises a charge blocking material vertically between each of the charge storage structures and an adjacent tier control gate, and dielectric material horizontally between each of the charge storage structures and an adjacent tier dielectric material. Additionally, the semiconductor structure comprises channel material extending through the stack of alternating tier dielectric materials and tier control gates.

Figure 14:
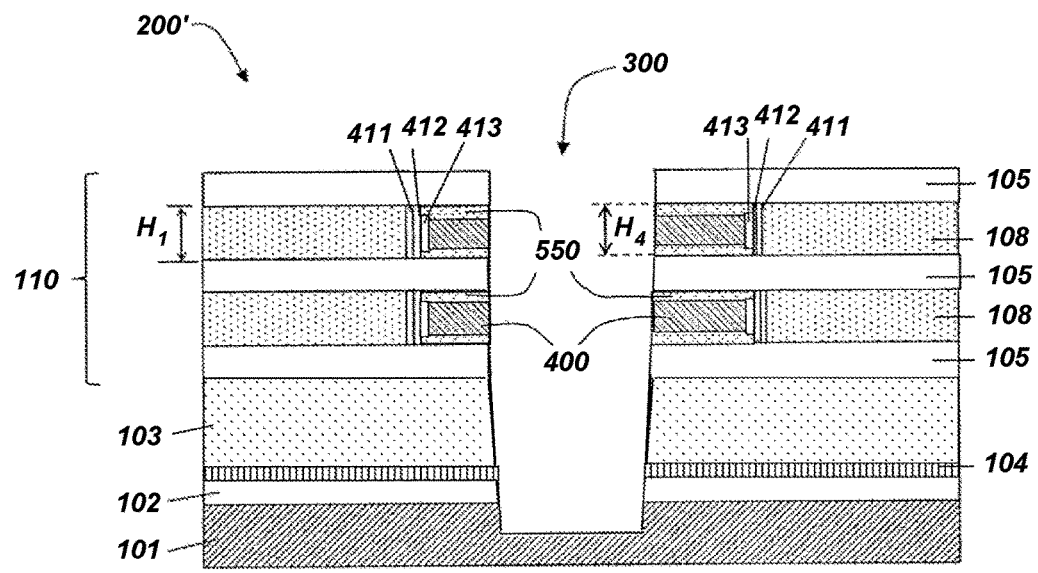
FIGS. 14-16 are cross-sectional views of various stages in the formation of a semiconductor structure according to another embodiment of the present disclosure.
Figure 15:
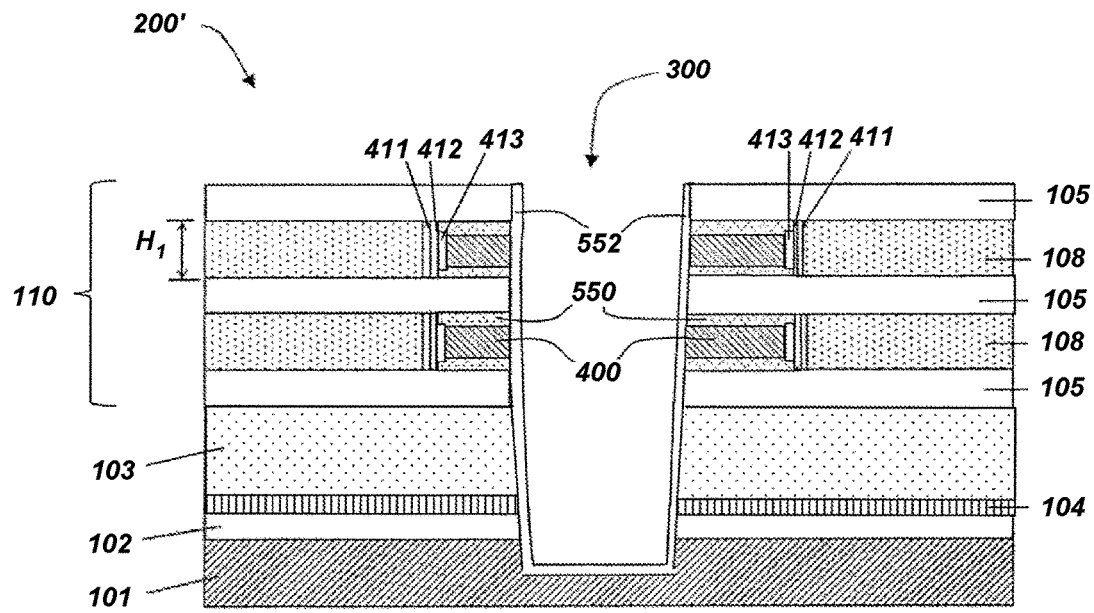
Figure 16:
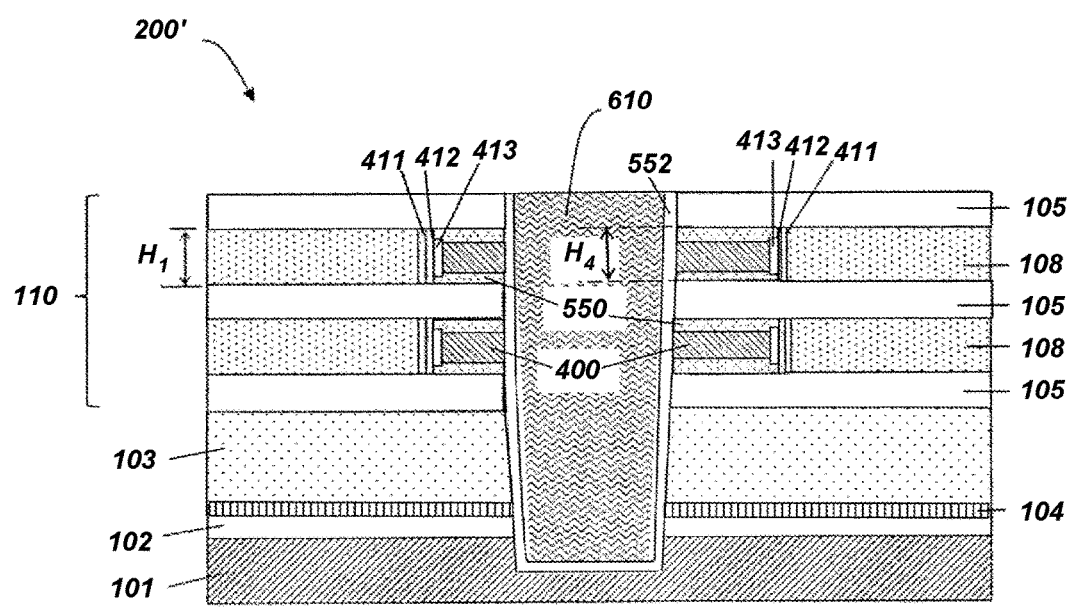

FIGS. 14-16 show another embodiment of the present disclosure. The air gaps 500 in the semiconductor structure 200 of FIG. 10 may be substantially filled with a conductive material 550 to provide the semiconductor structure 200' of FIG. 14. The conductive material 550 may be formed in the air gaps 500 using any conventional technique. The conductive material 550 may be independently selected to be the same or different material as the floating gate material 400.

In some embodiments, the conductive material 550 of FIG. 14 may be polysilicon material. The polysilicon material 550 may be undoped, n-doped, or p-doped polysilicon. In one embodiment, the polysilicon material 550 comprises the same material as the floating gate material 400. For example, the polysilicon material 550 and the floating gate material 400 may both be n-doped polysilicon material.

As shown in FIG. 14, the semiconductor structure 200' includes charge storage structures, each composed of the floating gate 400 and the conductive material 550 around the floating gate 400. Each of the charge storage structures has a height of $H_4$ that is substantially the same as the height $H_1$ of the adjacent tier control gate 108. Therefore, in this particular embodiment, the charge storage structure (400 and 550) of the semiconductor structure 200' is substantially aligned with the adjacent tier control gate material 108.

In FIG. 15, a tunnel dielectric material 552 (hereinafter sometimes referred to as "tunnel oxide material" by example) may be formed on the sidewalls of the opening 300. In some embodiments, the tunnel dielectric material 552 may be silicon oxide. Any conventional method for forming a tunnel dielectric material 552 may be used.

In FIG. 16, a channel material 610 may be formed to substantially fill the opening 300 of the semiconductor structure 200'. By way of non-limiting example, the channel material 610 may be conductively doped polysilicon. Any conventional method for forming the channel material 610 may be used. The channel material 610 may be independently selected to be the same or different materials from at least one of the conductive material 550 and the floating gate material 400. In one embodiment, the channel material 610, the conductive material 550, and the floating gate material 400 comprise conductively doped polysilicon.

As shown in FIG. 16, the semiconductor structure 200' does not include any charge trapping portion (e.g., nitride portion 412) disposed horizontally between the charge storage structure (i.e., the floating gate 400 and the conductive material 550 around the floating gate 400) and adjacent tier dielectric materials 105. Therefore, charge trapping issues may be reduced or eliminated. Furthermore, the semiconductor structure 200' includes discrete conductive structures, each having the height of $H_4$ that is substantially the same as the height $H_1$ of adjacent tier control gate 108. The discrete conductive structures (400 and 550) of the semiconductor structure 200' align with the adjacent tier control gates 108, resulting in a desirably reduced charge trapping volume.

Accordingly, disclosed in one embodiment of present disclosure is a method of fabricating a semiconductor structure. The method comprises forming an opening through a stack of alternating tier dielectric materials and tier control gate materials, laterally removing a portion of each of the tier control gate materials to form control gate recesses, and forming a charge blocking material on exposed surfaces of the tier dielectric materials and the tier control gate materials in the opening. The charge blocking material comprises a charge trapping portion. The method further comprises filling the control gate recesses with a charge storage material. Additionally, the method comprises removing the charge trapping portion of the charge blocking material disposed horizontally between the charge storage material and an adjacent tier dielectric material to produce air gaps between the charge storage material and the adjacent tier dielectric material. Further, the method comprises filling the air gaps with a dielectric material or a conductive material.

Figure 17:
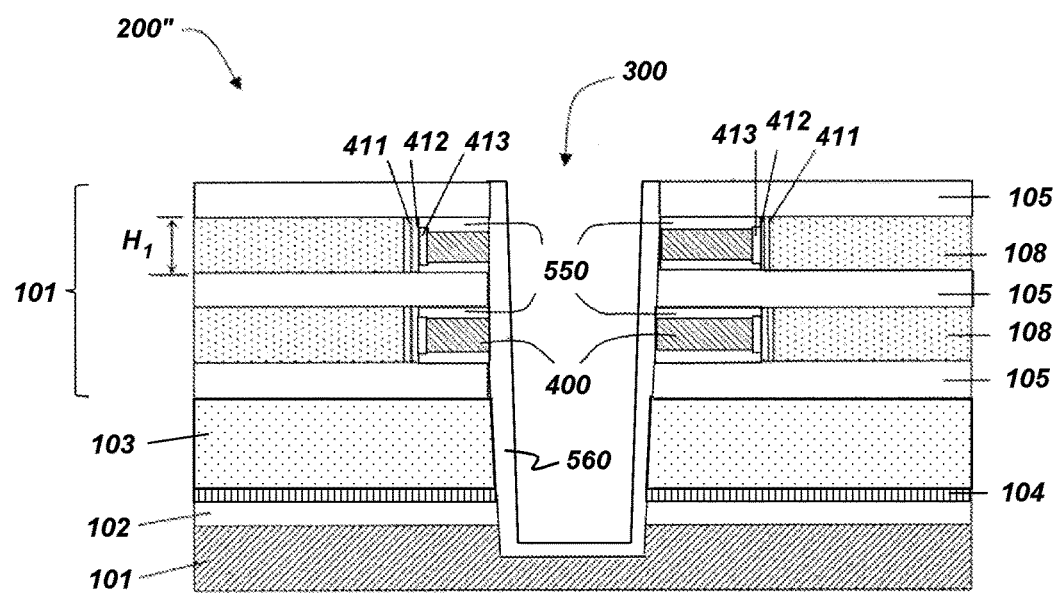
FIGS. 17-19 are cross-sectional views of various stages in the formation of a semiconductor structure according to yet another embodiment of the present disclosure.
Figure 18:
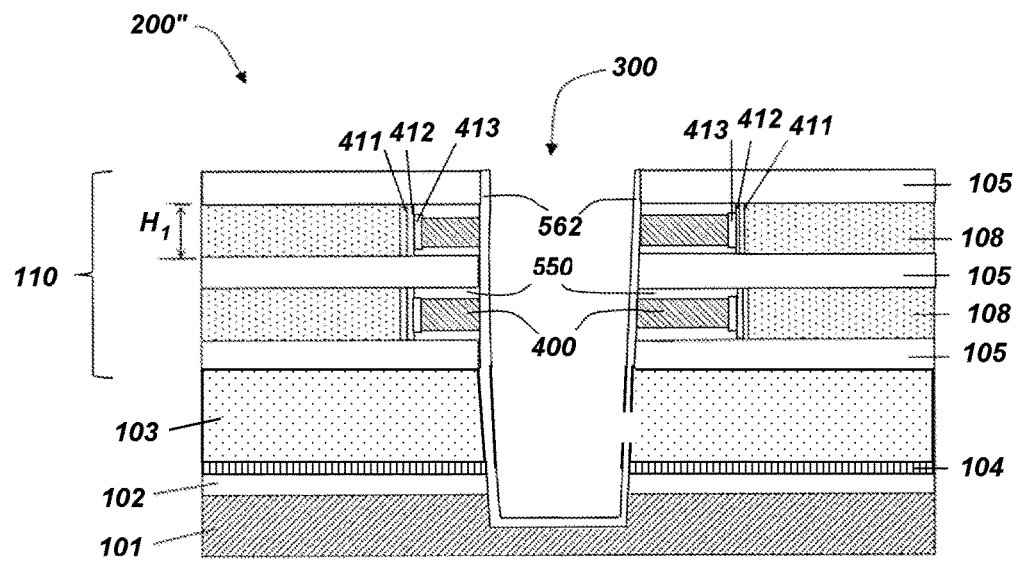
Figure 19:
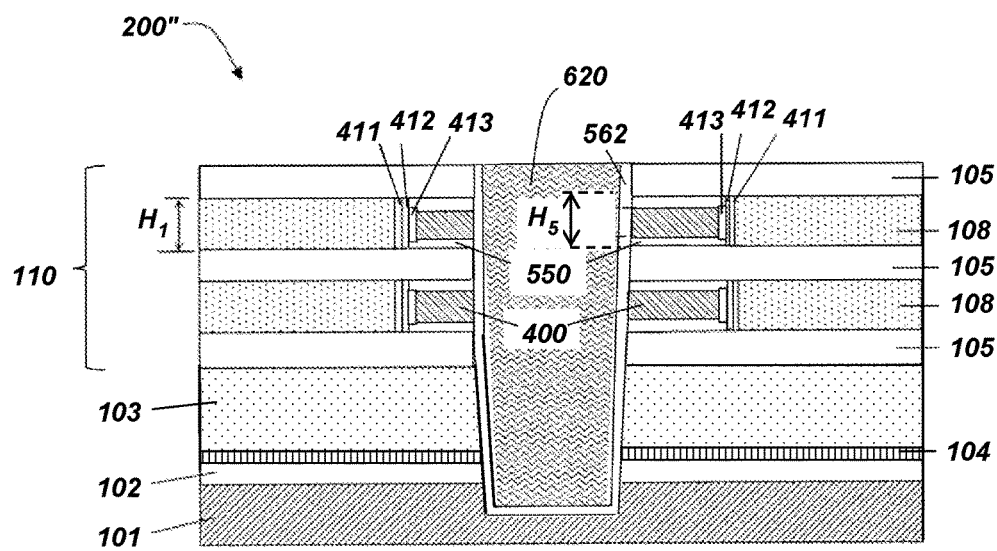

FIGS. 17-19 show an additional embodiment of present disclosure. In this particular embodiment, the conductive material 550 of FIG. 14 is undoped polysilicon material.

As shown in FIG. 17, a thin undoped polysilicon material 560 is conformally formed on exposed surfaces of the opening 300. By way of non-limiting example, the thin undoped polysilicon material 560 may have a thickness of about 20 Å to about 100 Å. The opening 300 may be pre cleaned prior to the formation of the thin undoped polysilicon material 560. Then, thin undoped polysilicon material 560 may be oxidized and the resulting oxide material may be removed by hydrofluoric acid or other suitable chemistry to provide a continuous thinner (e.g., ultra-thin) undoped polysilicon material on the exposed surfaces of the opening 300. Thereafter, the continuous thinner undoped polysilicon material 560 may be oxidized to form a tunnel oxide material 562 as shown in FIG. 18.

In FIG. 19, a channel material 620 may be formed to substantially fill the opening 300 of the semiconductor structure 200". By way of non-limiting example, the channel material 620 may be conductively doped polysilicon. Any conventional method for forming the channel material 620 may be used.

In some embodiments, the thin undoped polysilicon material 560 of FIG. 17 may be sufficiently thin enough that it could be oxidized to provide a tunnel oxide material 562 as shown in FIG. 18 in a single oxidation step.

As shown in FIG. 19, the semiconductor structure 200" does not include any charge trapping portion (e.g., nitride portion 412) disposed horizontally between the charge storage structure (i.e., the floating gate 400 and the conductive material 550 around the floating gate 400) and adjacent tier dielectric materials 105. Therefore, charge trapping issues may be reduced or eliminated. Furthermore, the semiconductor structure 200" includes discrete conductive structures, each having the height of $H_5$ that is substantially the same as the height $H_1$ of adjacent tier control gate 108. The discrete conductive structures (400 and 550) of the semiconductor structure 200' align with the adjacent tier control gates 108, resulting in a desirably reduced charge trapping volume.

Accordingly, in one embodiment of present disclosure, a semiconductor structure comprises a stack of alternating tier dielectric materials and tier control gates, and a floating gate material laterally adjacent to each of the tier control gates. The semiconductor structure further comprises a charge blocking structure vertically between each of the charge storage structure and an adjacent tier control gate, and a conductive material horizontally between the floating gate material and the respective adjacent tier dielectric material. Additionally, the semiconductor structure comprises a channel material extending through the stack of alternating tier dielectric materials and tier control gates.

As discussed herein, the semiconductor structure (200, 200', 200") of the present disclosure does not include charge trapping material (e.g., nitride material 412) disposed horizontally between the floating gate 400 and adjacent tier dielectric materials 105. Therefore, the undesirable charge trap in the horizontal charge trapping material may be eliminated.

Further, one or more embodiments of the present disclosure may enable an increased height of the charge storage structure (such as in the embodiment of FIGS. 14-16), without jeopardizing the critical dimensions and without the addition of complex acts to the process. Thus, in one or more embodiments of the present disclosure, the charge storage structures and control gates are aligned.

The semiconductor structure (200 of FIG. 13, 200' of FIG. 16, 200" of FIG. 19) may be subjected to further processing for production of a semiconductor device. In one embodiment, the semiconductor structure may be further processed by conventional techniques to form a semiconductor device, such as a 3D-NAND Flash memory device. However, while the embodiments are described in connection with 3D-NAND Flash memory devices, the disclosure is not so limited. The disclosure is applicable to other semiconductor structures and memory devices which may employ charge storage structures.

FIGS. 2-19 illustrate some embodiments of forming semiconductor structures 200, 200', 200" having charge storage structures for a 3D-NAND device, and do not necessarily limit the number of alternating tier dielectric materials 105 and tier control gate materials 108 in the stack 110. In addition, the locations, numbers, and shapes of the charge storage structures, or the profile and shape of the channel material 600, 610, 620 are not limited to the illustrated embodiments.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. A method of fabricating a semiconductor structure, the method comprising:

forming at least one opening through a stack of alternating tier dielectric materials and tier control gate materials;

removing lateral portions of each of the tier control gate materials to form control gate recesses;

forming a charge blocking material on exposed surfaces of the tier dielectric materials and the tier control gate materials in the at least one opening, the charge blocking material comprising a charge trapping portion;

filling the control gate recesses with a charge storage material;

removing the charge trapping portion of the charge blocking material disposed horizontally between the charge storage material and an adjacent tier dielectric material to produce air gaps between the charge storage material and the adjacent tier dielectric material; and filling the air gaps with a dielectric material, wherein filling the air gaps comprises forming a silicon oxide material in the air gaps and wherein forming a silicon oxide material in the air gaps comprises, forming a low quality silicon oxide material in the air gaps, and converting the low quality silicon oxide material to a higher quality silicon oxide material.

2. The method of claim 1, wherein forming a charge blocking material comprises:
- forming a first dielectric material on the exposed surfaces of the tier control gate materials in the control gate recesses;
- forming a second dielectric material on the first dielectric material and on the exposed surfaces of the tier dielectric materials, the second dielectric material comprising a charge trapping material; and
- conformally forming a third dielectric material over the second dielectric material.

3. The method of claim 1, wherein removing the charge trapping portion of the charge blocking material disposed horizontally between the charge storage material and an adjacent tier dielectric material comprises:
- selectively removing the charge trapping portion disposed horizontally between the charge storage material and the adjacent tier dielectric material without substantially removing portions of the charge blocking material disposed vertically between the charge storage material and the adjacent tier control gate material.

4. The method of claim 1, wherein forming a silicon oxide material in the air gaps comprises forming the silicon oxide material using a process selected from the group consisting of an in situ steam generation (ISSG) process, an atomic layer deposition (ALD) process, a furnace growth (diffusion) process, and combinations thereof.

5. The method of claim 1, wherein filling the control gate recesses with a charge storage material comprises forming the charge storage material laterally adjacent to the charge blocking material.

6. The method of claim 1, further comprising extending the at least one opening through a control gate material of a select device, an oxide material underlying the control gate material of the select device, and into a portion of a source.

7. The method of claim 6, further comprising forming a tunnel dielectric material conformally on sidewalls of the at least one opening.

8. The method of claim 7, further comprising, after forming the tunnel dielectric material conformally on the at least one opening, filling the at least one opening with a channel material.

9. A method of fabricating a semiconductor structure, the method comprising:
- forming at least one opening through a stack of alternating tier dielectric materials and tier control gate materials;
- removing lateral portions of each of the tier control gate materials to form control gate recesses;
- forming a charge blocking material on exposed surfaces of the tier dielectric materials and the tier control gate materials in the at least one opening, the charge blocking material comprising a charge trapping portion;
- filling the control gate recesses with a charge storage material;
- removing the charge trapping portion of the charge blocking material disposed horizontally between the charge storage material and an adjacent tier dielectric material to produce air gaps between the charge storage material and the adjacent tier dielectric material; and
- filling the air gaps with a conductive material,
  - wherein filling the air gaps comprises forming the conductive material in the air gaps.

10. The method of claim 9, wherein forming the conductive material in the air gaps comprises forming a conductive material selected from the group consisting of undoped polysilicon, n-doped polysilicon, and p-doped polysilicon.

11. A method of claim 9, wherein forming a charge blocking material on exposed surfaces of the tier dielectric materials and the tier control gate materials comprises forming the charge blocking material on recessed sidewalls of the tier control gate materials and on horizontal surfaces and vertical surfaces of the tier dielectric materials.

12. The method of claim 9, further comprising conformally forming an undoped polysilicon material on exposed surfaces of the at least one opening.

13. The method of claim 12, further comprising oxidizing the undoped polysilicon material to a tunnel oxide material.

* * * * *

UNITED STATES PATENT AND TRADEMARK OFFICE
CERTIFICATE OF CORRECTION

PATENT NO. : 10,121,670 B2
APPLICATION NO. : 15/678747
DATED : November 6, 2018
INVENTOR(S) : John D. Hopkins It is certified that error appears in the above-identified patent and that said Letters Patent is hereby corrected as shown below:

In the Claims

Claim 1, Column 10, Line 63, change "air gaps comprises," to --air gaps comprises:--

Signed and Sealed this
Eleventh Day of December, 2018

Andrei Iancu
*Director of the United States Patent and Trademark Office*